(12) United States Patent
Seely et al.

(10) Patent No.: US 6,774,737 B1
(45) Date of Patent: Aug. 10, 2004

(54) HIGH Q RESONATOR CIRCUIT

(75) Inventors: Warren L. Seely, Chandler, AZ (US); Thomas E. Van Lew, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/426,482

(22) Filed: Apr. 30, 2003

(51) Int. Cl.[7] .............................. H03B 5/08; H03H 5/12; H03J 3/18; H03J 3/20
(52) U.S. Cl. ..................... 331/177 V; 333/175; 334/15; 334/78
(58) Field of Search .......................... 331/36 C, 117 R, 331/117 FE, 117 D, 167, 177 V; 333/167, 175, 177; 334/11, 14, 15, 64, 78, 79, 83

(56) References Cited

U.S. PATENT DOCUMENTS

| | | | | |
|---|---|---|---|---|
| 3,571,754 A | * | 3/1971 | Healey et al. | .......... 331/116 R |
| 3,918,085 A | * | 11/1975 | Numakura et al. | ........... 386/22 |
| 4,614,925 A | * | 9/1986 | Kane | .......................... 333/174 |
| 4,999,589 A | * | 3/1991 | DaSilva | .................. 331/117 R |
| 5,494,030 A | * | 2/1996 | Swartz et al. | ................ 600/323 |
| 6,504,443 B1 | | 1/2003 | Eguizabal | |

* cited by examiner

*Primary Examiner*—David Mis
(74) *Attorney, Agent, or Firm*—Frank J. Bogacz

(57) ABSTRACT

A resonator circuit (10) has a pair of varactor diodes (13, 14), a capacitor (15), and a transformer (20) coupled in parallel with the capacitor and varactor diodes. Further, in order to provide a high frequency output an impedance inverter network (35, 36) is coupled to the transformer.

28 Claims, 1 Drawing Sheet

HIGH Q RESONATOR CIRCUIT

BACKGROUND OF THE INVENTION

The present invention pertains to high rate data transfers and more particularly to high Q resonator circuits used in voltage controlled oscillators and the like.

Voltage controlled oscillators typically require a resonator circuit. Generally, resonator circuits are well known in the art and have been developed for many, many years. Such parallel resonant networks are fundamental circuits which are well known in the art.

High Q resonators are commonly available for use in voltage controlled oscillators. However, such resonator circuits are typically expensive; usually require custom design for each individual application; and are difficult to slew over any appreciable bandwidth.

Accordingly, it would be highly desirable to have a high Q resonator circuit for use with voltage controlled oscillators which is inexpensive, and provides for operation over a substantial bandwidth.

DESCRIPTION OF THE PREFERRED EMBODIMENT OF THE INVENTION

Figure 1:
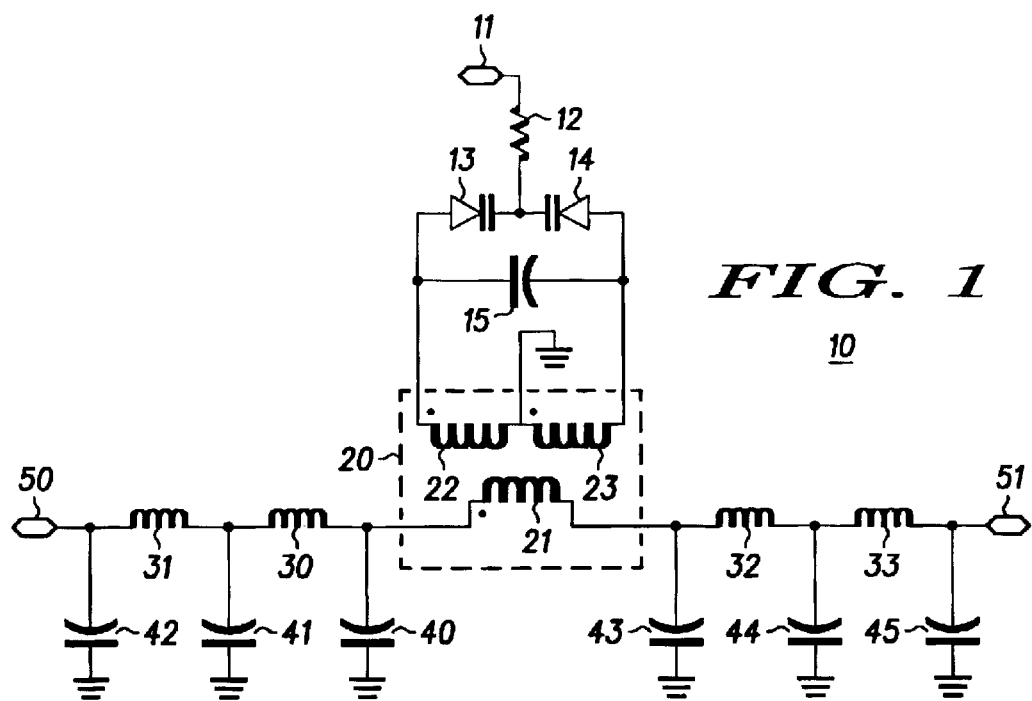
FIG. 1 is a schematic diagram of a high Q resonator circuit in accordance with the present invention.

Referring to FIG. 1, a schematic diagram of a resonator circuit embodying the principles of operation of the present invention is shown. Resonator circuit 10 includes tuning voltage input 11 connected to resistor 12. Resistor 12 is further connected in series with the common connection of the cathodes of varactor diodes 13 and 14. Capacitor 15 is connected between the anodes of varactor diodes 13 and 14.

One side of transformer 20 is coupled across capacitor 15 and varactor diodes 13 and 14 in parallel. This one side of transformer 20 includes windings 22 and 23 which have a center tab connected to ground. Transformer 20 is a lightly coupled transformer of approximately 10:1 turns ratio.

The other side of transformer 20 is winding 21. Transformer 20, capacitor 15 and varactor diodes 13 and 14 form a parallel resonant network which uses the self inductance of transformer 20 along with the capacitance of capacitor 15 to set the resonant frequency.

Between winding 21 of transformer 20 and each output terminal 50 and 51 and impedance inverter networks 35 and 36 is coupled. The impedance inverter networks 35 and 36 are formed using series connected inductors and shunt capacitors in a low pass filter (LPF) configuration. As shown in FIG. 1, impedance inverter network 35 includes a series connection of inductors 30 and 31 between winding 21 of the transformer 20 and output 50. Further, impedance inverter network 35 includes shunt capacitors 40, 41 and 42 are connected between each of the inductors 30 and 31 to ground. Similarly, impedance inverter network 36 has inductors 32 and 33 connected between winding 21 of transformer 20 and output terminal 51. Capacitors 43, 44 and 45 are shunt connected to ground between inductors 32 and 33.

The number of inductors and capacitors in impedance inverter networks 35 and 36 is a design parameter. However, in a preferred embodiment of the invention, two series connected inductors or less also in a preferred embodiment the number of shunt capacitors, for example 40, 41 and 42, should be three or less. Further, in a preferred embodiment, the value of inductors 30–33 is approximately 1–2 nH and the value of capacitors 42–45 is approximately 40 pF. Each of the inductors 30–33 and each of the capacitors 40–45 are substantially the same thereby simplifying the design and providing for low cost in implementation.

The resonant frequency Q is determined by the resistive losses in the parallel resonator circuit performed by the capacitor 15, varactor diodes 14, and transformer 20 including the turns ratio. The Q is unaffected by losses in the impedance inverter networks 35 and 36 or the primary site 21 of transformer 20.

The circuit values required are ideally suited for discrete component implementation. Further, the resonator circuit of FIG. 1 is easily implemented using gallium arsenide (GaAs) monolithic memory integrated circuit (MMIC) technology as well as other commonly available integrated circuit technologies.

The resonator circuit depicted in FIG. 1 is suited for use in communication systems. For example, the resonator circuit 10 may be used in voltage controlled oscillators for mobile telecommunication base station transceivers and telecommunication handsets. Resonator circuits may be applied equally well to both transmission and reception synthesizers.

A suitable range for resistor 12 is approximately 2 K to 10 K ohms with a preferred value of approximately 5 K ohms. Any commonly available varactor diodes in a high frequency range are suitable for varactor diodes 13 and 14.

The outputs 50 and 51 of resonator circuit 10 are identical and either may be used. However, one or the other may be used and the one output 50 or 51 not in use is typically connected to a resistance of 100 ohms or less (not shown).

Since the resonant circuit 10 may be miniaturized, a substantial cost reduction may be realized from smaller areas on printed circuit boards which are required for the resonant circuit. Further, the cost of an associated voltage controlled oscillator with the current resonator circuit 10 will be reduced to half or less of the current cost. Since the area on the printed circuit board required for the resonant circuit and voltage controlled oscillator is smaller, this invention reduces the printed circuit board area required for both the receive and transmit synthesizers of a base station of a mobile communication system.

Figure 2:
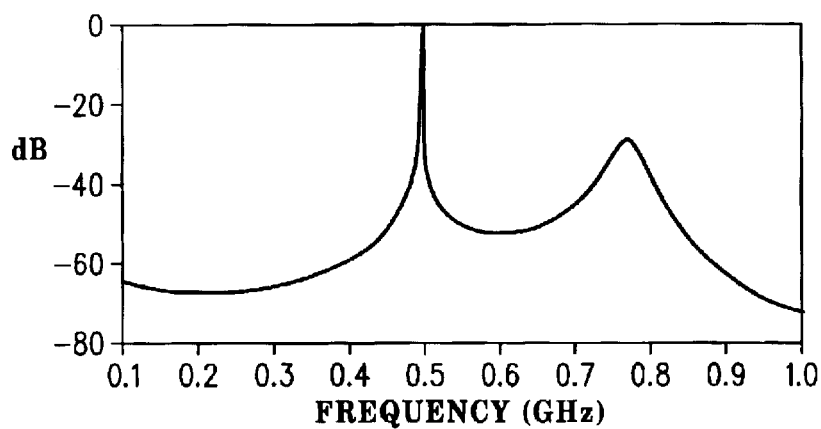
FIG. 2 is a diagram depicting the output of the resonator circuit over a frequency range using a fixed frequency.

Referring to FIG. 2, a fixed frequency response plot of frequency versus attenuation is shown. The plot shows almost no attenuation at approximately 0.5 ghz.

Figure 3:
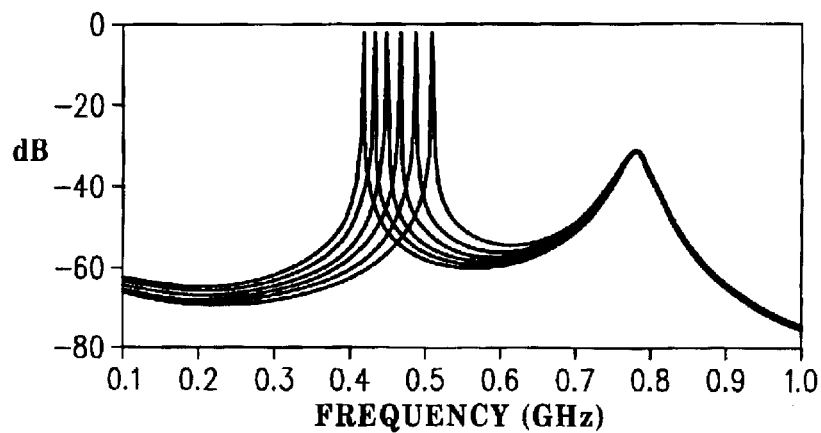
FIG. 3 is a diagram depicting output of the resonator circuit over a frequency range for various incrementally tuned frequencies.

FIG. 3 depicts the frequency response of resonance circuit 10 for a number of incrementally tuned frequencies. The plot shows that for a number of frequencies between 0.4 ghz and 0.5 ghz the attenuation is nearly zero. These are very high frequency responses for the resonant circuit.

The various frequency responses shown in FIG. 3 result from manipulation the capacitance of capacitor 15 and the self-inductance of transformer windings 22 and 23 for a particular parallel resonant frequency of interest.

Although the preferred embodiment of the invention has been illustrated, and that form described in detail, it will be readily apparent to those skilled in the art that various modifications may be made therein without departing from the spirit of the present invention or from the scope of the appended claims.

What is claimed is:

1. A resonator circuit comprising:
   an input;
   first and second varactor diodes having a common cathode connection, the common cathode connection coupled to the input;
   a capacitor coupled to anodes of the first and second varactor diodes; and
   a transformer having lightly coupled first and second sides, said first side coupled in parallel with said capacitor and with said first and second varactor diodes, said second side providing a high frequency, high Q, non-attenuated output.

2. The resonator circuit as claimed in claim 1, wherein there is further included an impedance inverter network coupled between the second side of the transformer and the high frequency non-attenuated output.

3. The resonator circuit as claimed in claim 2, wherein the impedance inverter network includes first and second impedance inverter networks, said first impedance inverter network coupled between a first terminal of said second side of said transformer and said second impedance inverter network coupled between a second terminal of said second side of said transformer.

4. The resonator circuit as claimed in claim 3, wherein each of the first and second impedance inverter networks include:
   at least one inductor coupled between a terminal of the second side of the transformer and the high frequency non-attenuated output; and
   at least one capacitor coupled between the at least one inductor and the terminal of the second side of the transformer and ground.

5. The resonator circuit as claimed in claim 4, wherein each of the first and second impedance inverter networks include:
   a series connection of first and second inductors coupled between the high frequency non-attenuated output and the terminal of the second side of the transformer;
   a plurality of capacitors coupled between the first and second inductors and ground, the plurality of capacitors including a first capacitor coupled between the first inductor and the terminal of the second side of the transformer;
   a second capacitor coupled between the first and second inductors and ground; and
   a third capacitor connected between the high frequency non-attenuated output, the second inductor and ground.

6. The resonator circuit as claimed in claim 1, wherein the transformer includes a coupling of the first and second sides of the transformer at a turns ratio of approximately 10:1.

7. The resonator circuit as claimed in claim 1, wherein the first side of the transformer includes first and second windings having a center tap connected to ground.

8. In a voltage controlled oscillator, a resonator circuit comprising:
   an input;
   first and second varactor diodes having a common cathode connection, the common cathode connection coupled to the input;
   a capacitor coupled to anodes of the first and second varactor diodes; and
   a transformer having lightly coupled first and second sides, said first side coupled in parallel with said capacitor and with said first and second varactor diodes, said second side providing a high frequency, high Q, non-attenuated output.

9. The resonator circuit as claimed in claim 8, wherein there is further included an impedance inverter network coupled between the second side of the transformer and the high frequency non-attenuated output.

10. The resonator circuit as claimed in claim 9, wherein the impedance inverter network includes first and second impedance inverter networks, said first impedance inverter network coupled between a first terminal of said second side of said transformer and said second impedance inverter network coupled between a second terminal of said second side of said transformer.

11. The resonator circuit as claimed in claim 10, wherein each of the first and second impedance inverter networks include:
    at least one inductor coupled between a terminal of the second side of the transformer and the high frequency non-attenuated output; and
    at least one capacitor coupled between the at least one inductor and the terminal of the second side of the transformer and ground.

12. The resonator circuit as claimed in claim 11, wherein each of the first and second impedance inverter networks include:
    a series connection of first and second inductors coupled between the high frequency non-attenuated output and the terminal of the second side of the transformer;
    a plurality of capacitors coupled between the first and second inductors and ground, the plurality of capacitors including a first capacitor coupled between the first inductor and the terminal of the second side of the transformer;
    a second capacitor coupled between the first and second inductors and ground; and
    a third capacitor connected between the high frequency non-attenuated output, the second inductor and ground.

13. The resonator circuit as claimed in claim 8, wherein the transformer includes a coupling of the first and second sides of the transformer at a turns ratio of approximately 10:1.

14. The resonator circuit as claimed in claim 8, wherein the first side of the transformer includes first and second windings having a center tap connected to ground.

15. In a telecommunication system base station, in a voltage controlled oscillator, a resonator circuit comprising:
    an input;
    first and second varactor diodes having a common cathode connection, the common cathode connection coupled to the input;
    a capacitor coupled to anodes of the first and second varactor diodes; and
    a transformer having lightly coupled first and second sides, said first side coupled in parallel with said capacitor and with said first and second varactor diodes, said second side providing a high frequency, high Q, non-attenuated output.

16. In a telecommunication system base station, in a voltage controlled oscillator, the resonator circuit as claimed in claim 15, wherein there is further included an impedance inverter network coupled between the second side of the transformer and the high frequency, high Q, non-attenuated output.

17. In a telecommunication system base station, in a voltage controlled oscillator, the resonator circuit as claimed in claim 16, wherein the impedance inverter network includes first and second impedance inverter networks, said first impedance inverter network coupled between a first terminal of said second side of said transformer and said second impedance inverter network coupled between a second terminal of said second side of said transformer.

18. In a telecommunication system base station, in a voltage controlled oscillator, the resonator circuit as claimed in claim 17, wherein each of the first and second impedance inverter networks include:
   at least one inductor coupled between a terminal of the second side of the transformer and the high frequency non-attenuated output; and
   at least one capacitor coupled between the at least one inductor and the terminal of the second side of the transformer and ground.

19. In a telecommunication system base station, in a voltage controlled oscillator, the resonator circuit as claimed in claim 17, wherein each of the first and second impedance inverter networks include:
   a series connection of first and second inductors coupled between the high frequency non-attenuated output and the terminal of the second side of the transformer;
   a plurality of capacitors coupled between the first and second inductors and ground, the plurality of capacitors including a first capacitor coupled between the first inductor and the terminal of the second side of the transformer;
   a second capacitor coupled between the first and second inductors and ground; and
   a third capacitor connected between the high frequency non-attenuated output, the second inductor and ground.

20. In a telecommunication system base station, in a voltage controlled oscillator, the resonator circuit as claimed in claim 15, wherein the transformer includes a coupling of the first and second sides of the transformer at a turns ratio of approximately 10:1.

21. In a telecommunication system base station, in a voltage controlled oscillator, the resonator circuit as claimed in claim 15, wherein the first side of the transformer includes first and second windings having a center tap connected to ground.

22. In a telecommunication handset, in a voltage controlled oscillator, a resonator circuit comprising:
   an input;
   first and second varactor diodes having a common cathode connection, the common cathode connection coupled to the input;
   a capacitor coupled to anodes of the first and second varactor diodes; and
   a transformer having lightly coupled first and second sides, said first side coupled in parallel with said capacitor and with said first and second varactor diodes, said second side providing a high frequency, high Q, non-attenuated output.

23. In a telecommunication handset, in a voltage controlled oscillator, the resonator circuit as claimed in claim 22, wherein there is further included an impedance inverter network coupled between the second side of the transformer and the high frequency, high Q, non-attenuated output.

24. In a telecommunication system base station, in a voltage controlled oscillator, the resonator circuit as claimed in claim 22, wherein the impedance inverter network includes first and second impedance inverter networks, said first impedance inverter network coupled between a first terminal of said second side of said transformer and said second impedance inverter network coupled between a second terminal of said second side of said transformer.

25. In a telecommunication handset, in a voltage controlled oscillator, the resonator circuit as claimed in claim 23, wherein each of the first and second impedance inverter networks include:
   at least one inductor coupled between a terminal of the second side of the transformer and the high frequency non-attenuated output; and
   at least one capacitor coupled between the at least one inductor and the terminal of the second side of the transformer and ground.

26. In a telecommunication handset, in a voltage controlled oscillator, the resonator circuit as claimed in claim 23, wherein each of the first and second impedance inverter networks include:
   a series connection of first and second inductors coupled between the high frequency non-attenuated output and the terminal of the second side of the transformer;
   a plurality of capacitors coupled between the first and second inductors and ground, the plurality of capacitors including a first capacitor coupled between the first inductor and the terminal of the second side of the transformer;
   a second capacitor coupled between the first and second inductors and ground; and
   a third capacitor connected between the high frequency non-attenuated output, the second inductor and ground.

27. In a telecommunication handset, in a voltage controlled oscillator, the resonator circuit as claimed in claim 22, wherein the transformer includes a coupling of the first and second sides of the transformer at a turns ratio of approximately 10:1.

28. In a telecommunication handset, in a voltage controlled oscillator, the resonator circuit as claimed in claim 22, wherein the first side of the transformer includes first and second windings having a center tap connected to ground.

* * * * *